United States Patent [19]

Robinson et al.

[11] Patent Number: 4,956,695
[45] Date of Patent: Sep. 11, 1990

[54] THREE-DIMENSIONAL PACKAGING OF FOCAL PLANE ASSEMBLIES USING CERAMIC SPACERS

[75] Inventors: William L. Robinson, El Toro; John C. Roth, Jr., Glendora, both of Calif.

[73] Assignee: Rockwell International Corporation, El Segundo, Calif.

[21] Appl. No.: 351,122

[22] Filed: May 12, 1989

[51] Int. Cl.$^5$ .................. H01L 23/02; H01L 23/12
[52] U.S. Cl. .................................. 357/74; 357/75; 357/76; 357/81
[58] Field of Search ............... 357/74, 75 C, 75, 76, 357/77, 81

[56] References Cited

FOREIGN PATENT DOCUMENTS

| 0075945 | 4/1983 | European Pat. Off. | 357/76 |
| 57-31166 | 2/1982 | Japan | 357/75 |
| 61-59862 | 3/1986 | Japan | 357/75 |

OTHER PUBLICATIONS

IBM Technical Disclosure Bulletin, vol. 31, No. 11, Apr. 1989, "Monolithic Ceramic Substrate and Heat Sink for Integrated Circuit Packages" p. 40.
IBM Technical Disclosure Bulletin, vol. 19, No. 12, May 1977, "Matching the Thermal Coefficient of Chips to Module Substrate."

Primary Examiner—Rolf Hille
Assistant Examiner—Steven Loke
Attorney, Agent, or Firm—H. Fredrick Hamann; George A. Montanye; David J. Arthur

[57] ABSTRACT

A three-dimensional focal plane array with accurate X, Y, and Z positioning of the connector leads and uniform thermal expansion characteristics may be constructed by forming a plurality of silicon dies, each having a silicon front face and a dielectric layer on the back face thereof. Each die has gold ribbon leads bonded to its silicon face, with the leads extending beyond the edge of the die. A ceramic spacer having a thickness substantially equal to the thickness of the die is placed adjacent an edge of the die, with the gold leads also bonded to the ceramic spacer. The ceramic spacers are formed of an electrically nonconductive material having a relatively low coefficient of thermal expansion, preferably substantially the same as the coefficient of thermal expansion for silicon. Epoxy is applied to the silicon face of the die and the dies are stacked and aligned so that the silicon face of one die is bonded with the epoxy to the dielectric face of the adjacent die. The spacers and protruding leads are lapped and polished to form a planar bonding surface.

14 Claims, 6 Drawing Sheets

THREE-DIMENSIONAL PACKAGING OF FOCAL PLANE ASSEMBLIES USING CERAMIC SPACERS

The invention herein described was made in the course of and/or under Contract No. DASG60-86-C-0095 with the Department of the Army.

BACKGROUND OF THE INVENTION

The signals produced by the detectors of an array of detectors, such as those of an infrared focal plane array, must generally be processed by signal processing electronics. Focal plane arrays may be used on spacecraft for detecting infrared (IR) or other radiation. The signal processing electronics may be implemented on a plurality of semiconductor chips that are stacked together and electrically connected along one edge to the detectors of the array.

In the three-dimensional (3-D) packaging of such electronics, the silicon die are stacked together vertically, and bonded together to form a module assembly. Such packaging necessitates the routing of conductors from the silicon face of the die to the edge of the die for placement of connections to the next assembly, such as the connector pads for the detectors. For example, the module may be connected to an infrared detector array. Such connections may be made through indium bumps on the backside of the detector array. Good electrical connections must be made between the detectors of the detector array and the connectors to the electronics of the silicon die. This requires that the connectors be accurately positioned, and that the plane containing the ends of the connectors be extremely smooth to accurately mate with the detector array. It is also important to maintain electrical isolation of the conductors from each other and from adjacent silicon die, and to electrically isolate the dies from each other.

In modern focal plane detector array technology, an objective is to increase the density of the detectors, which requires closer spacing of the conductors while maintaining electrical isolation. The centers of the detectors may be only 0.005 inches apart. The conductors used to contact the detectors and connect them to the die electronics are extremely narrow in width (perhaps 0.003 inches), and extremely thin (perhaps on the order of 0.00025 inches). Furthermore, the conductors or leads may be formed of extremely fine gold, which is a soft material.

SUMMARY OF THE INVENTION

The method of fabricating a three-dimensional focal plane array according to the invention includes forming a plurality of silicon die, each containing a signal processing circuitry on the front face, and a dielectric layer on the back face thereof. On each die a gold ribbon lead is bonded to the front face of the die. The ribbon lead extends beyond the edge of the die. A metallized ceramic spacer having a thickness substantially equal to the thickness of the die (silicon and dielectric together) is placed adjacent the edge of the die, and the gold ribbon lead is bonded to the ceramic spacer. An epoxy bonding material is applied to the silicon face of the die. A plurality of the die and their associated ceramic spacers are stacked and aligned so that the front face of one die is bonded with the epoxy to the dielectric face of the adjacent die. The edges of the ceramic spacers are lapped and polished to expose the gold ribbon leads, and to produce a planar bonding surface.

The three-dimensional focal plane assembly of the invention includes a plurality of die assemblies stacked adjacent one another, in which each die assembly includes a silicon surface with electronic circuitry and a dielectric layer bonded to the opposite surface of the die. An edge of a ceramic spacer having a thickness substantially the same as the thickness of the silicon die and dielectric layer together abuts one edge of the silicon die. A gold ribbon lead is bonded to the electronic circuit of the silicon die and to the ceramic spacer.

Preferably, the ceramic spacers are formed of an electrically non-conductive material having a relatively low coefficient of thermal expansion, which may be substantially the same as the coefficient of thermal expansion for silicon.

DESCRIPTION OF THE PREFERRED EMBODIMENTS

Figure 1:
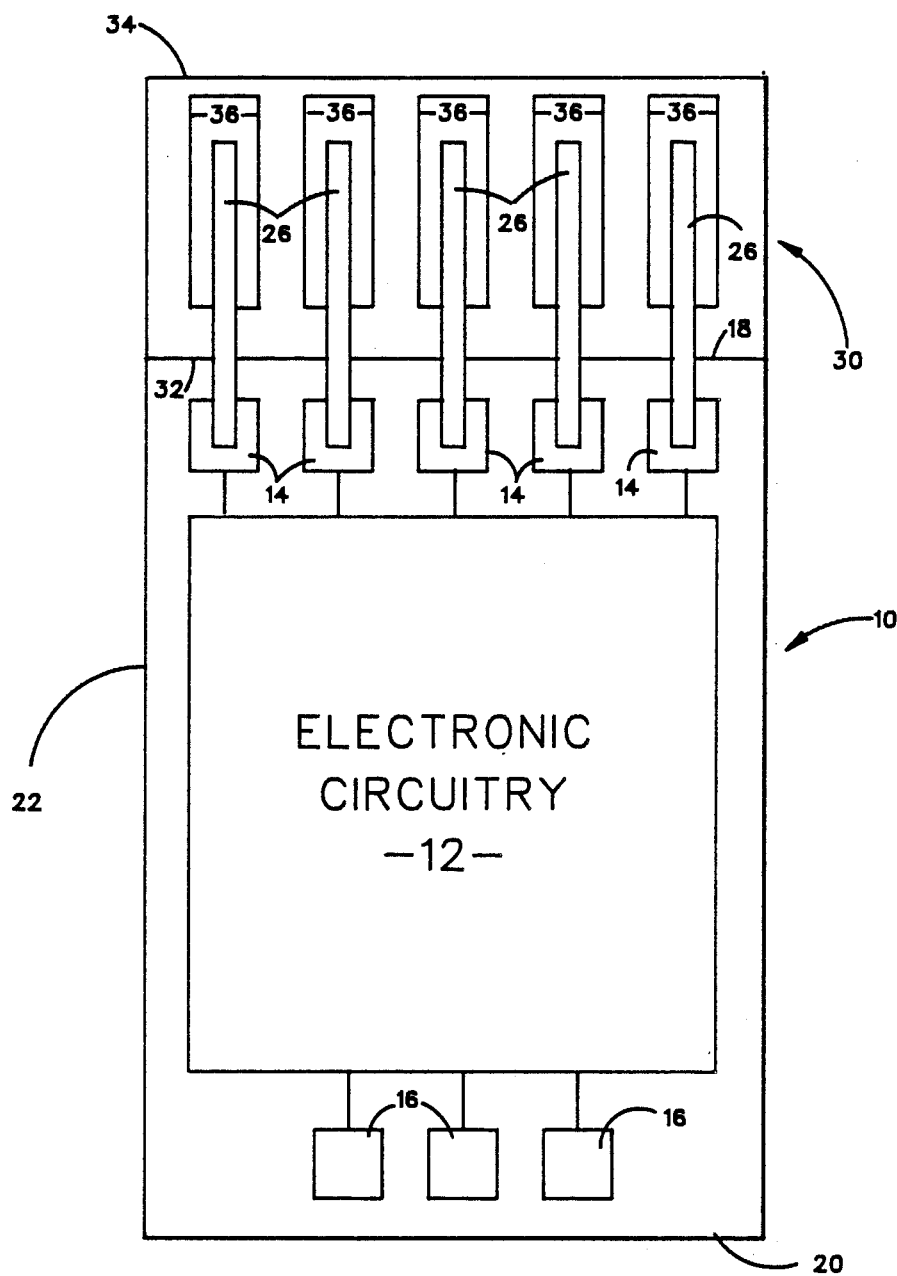
FIG. 1 is an elevational view of a die assembly comprising a silicon electronic die and ceramic spacer constructed according to the invention.

Referring first to FIG. 1, the front face of a silicon die or chip 10 is illustrated. Electronic circuitry 12, which may include signal processors, is contained on the center of the chip. Bonding pads 14, 16 near the perimeter of the chip are connected to the electronic circuitry and provide means by which connections may be made between the circuitry of the chip and other devices or systems.

The present description concerns the bonding pads 14 along a first edge 18 of the chip, and their connections to other system elements. In the focal plane array context, the bonding pads 14 along the first edge of the chip are connected to the detectors of the detector array for receiving signals from those detectors. The electronic circuitry 12 processes those signals, and the output is applied to the bonding pads 16 on a second edge 20 of the chip for connection to other circuitry or systems.

The silicon die or chip 10 is manufactured using conventional silicon electronics processing. This typically involves manufacturing a wafer containing a number of such dies, and then dicing or dividing the wafer into the individual dies. When the wafer is diced, at least one side of each die should be cut with extreme accuracy to facilitate later assembly of the silicon chips into the module assembly. Preferably a third side of the chip 22, perpendicular to the first side, is cut with such accuracy, and used later in aligning the die when they are stacked to form the module.

Figure 2:
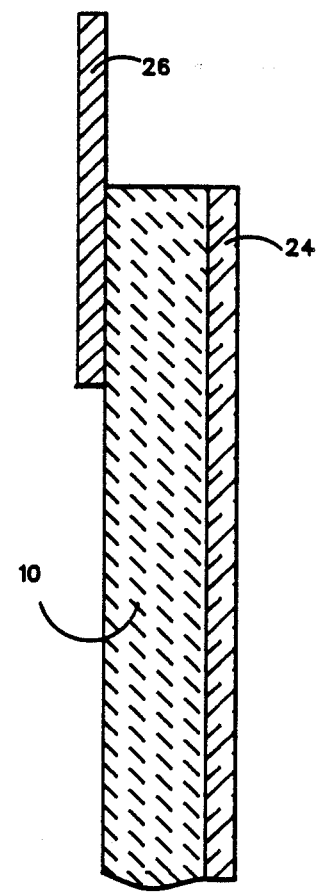
FIG. 2 is a cross sectional view of an electronic die.

For use in the present invention, a dielectric layer 24 is applied to the back side of the silicon wafer, preferably prior to dicing (see FIG. 2). This dielectric layer preferably has a thickness of approximately 1,000 Å and may be made of silicon nitride. Polyimide epoxy or other deposited nitrides or oxides may also be used. As the completed die assembly may need to have a particular total thickness, it may be desirable, prior to deposition of the dielectric layer, to lap the back side of the silicon wafer to a certain thickness, so that the combination of the silicon, dielectric, and a gold ribbon lead 26 (attached later) does not exceed a desired finished thickness. Thus, each die has a silicon front face and a dielectric back face. When the dies are stacked together, the dielectric 24 provides electrical insulation between adjacent dies.

A conductor 26, which is ideally a very fine, thin gold ribbon lead, is bonded to each bonding pad 14 on the chip. The ends of the gold ribbon leads extend beyond the edge of the chip, preferably about 0.025 inches. These leads may be, for example, 0.003 inches wide and 0.00025 inches thick. Each ribbon lead conductor is bonded to a bonding pad on the silicon chip in a conventional manner, as is well known in the semiconductor processing art. Examples include thermocompression wedge bonding and micro-gap welding.

A spacer 30 having a first edge 32 and a second edge 34 is placed with its first edge 32 adjacent and abutting the first edge 18 of the electronic die 10. Ideally, the spacer 30 has exactly the same thickness as the die (silicon and dielectric 24 together). In practice it is sufficient to bring the thickness of the die and the spacer to within 0.1 or 0.2 mil. The thickness of the spacer can be established within this accuracy by lapping it in the same manner as the silicon chip is lapped. Current silicon wafer processing techniques yield chips having suurface variations of up to 0.1 or 0.2 mil, so achieving greater accuracy in establishing the thickness of the spacer is not necessary. When there is doubt about the exact thickness of the spacer, it may be advantageous to form the spacer slightly thinner than the die. Preferably, the spacer has the same length as the width of the electronic die along the first edge 18. The width of the spacer between the first and second edges may be 0.030 inches.

The spacer is made of a ceramic material that is electrically non-conductive, and has a relatively low coefficient of thermal expansion. The coefficient of thermal expansion for the ceramic spacer is preferably substantially the same as the coefficient of thermal expansion for silicon of the chip. The material for the spacer should be also strong and rigid to withstand the pressures applied during the assembly of the module and during application of the detector array. A preferred material for the spacer is aluminum oxide ($Al_2O_3$). Other materials that may be suitable for the spacer are berillium oxide, aluminum nitride, and glass.

The sensitivity of the detectors of the array and the environment in which the array is to operate may affect the selection of the spacer material. Because the focal planes are used in spacecraft, a very low temperature environment, the heat generated by the electronic circuitry 12 may be significant. Therefore, the thermat insulation characteris:ics of the spacer may be important so that the heat generated does not affect the detectors of the array.

The ceramic spacer has metallized bonding areas 36 corresponding to the bonding pads 14 on the silicon die. Each gold ribbon lead 26 is then bonded to the corresponding metallized bonding area 36 on the ceramic spacer. The metallization facilitates the bonding of the conductor to the spacer. The bonding of the conductors to the metallized bonding aread is also conventional.

Prior to assembly in the stack, an epoxy bonding material is applied to the silicon face of the die.

The dies are then assembled in a stack, with their first edges (having the ceramic spacers) aligned. The exact cutting of the third side 22 of each die allows the dies and their associated spacers to be exactly aligned. Alignment of the chips is important for proper placement of the conductors 26 to make contact with the detectors of the detector array.

As the dies are stacked together, the epoxy material spreads out between the silicon face of the one die and the dielectric layer on the back of the adjacent die, and by capillary or wicking action, fills in the space between the dies.

Figure 3:
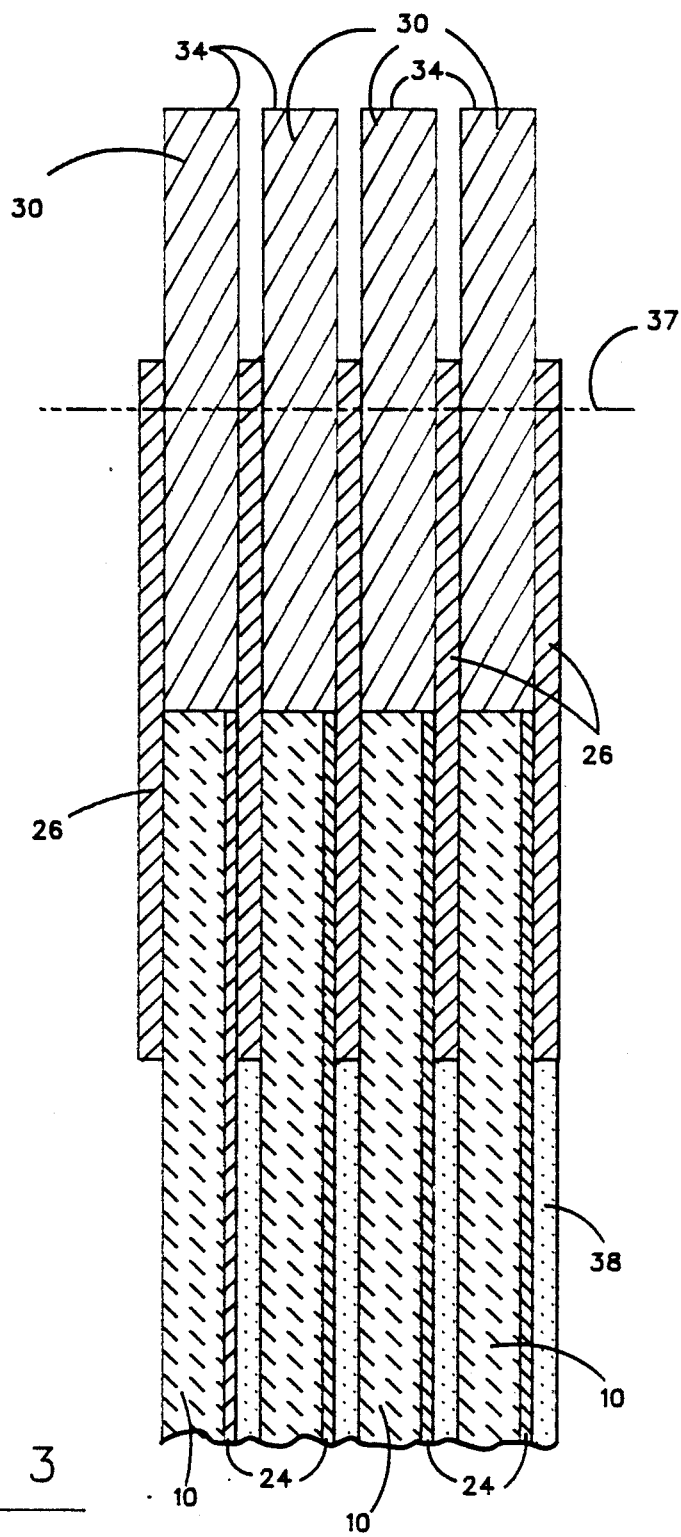
FIG. 3 is a cross sectional view of a stack of die assemblies, prior to lapping and polishing for application of the connection pads.

The epoxy also fills in around the gold ribbon lead 26, between the ceramic spacers 30. The stack is compressed, and the epoxy is cured, bonding the die together. A cross section of a portion of the assembled stack is shown in FIG. 3. The epoxy bonding material 38 filling the spaces between the die is shown. This view also shows the dielectric layer 24 insulating the gold ribbon attached to one die 10 from making electrical contact with the silicon of the adjacent die.

Ideally, after the module is compressed, the ceramic spacers 30 are separated only by the thickness of the ribbon connectors 26. To achieve this spacing, the tolerances for the thickness of the ceramic spacers and the silicon dies (and associated dielectric layers) must be extremely tight, as the thickness of the gold ribbon may be only 0.00025 inches. It is not practical to keep the tolerances so tight. Therefore, the spacers and the dies are generally made slightly thinner than required to ensure that the finished module does not exceed a desired finished size. When the module is compressed, a small space, filled with epoxy glue, remains between the spacers. The amount of space and glue between the spacers should be kept to a minimum.

Figure 4:
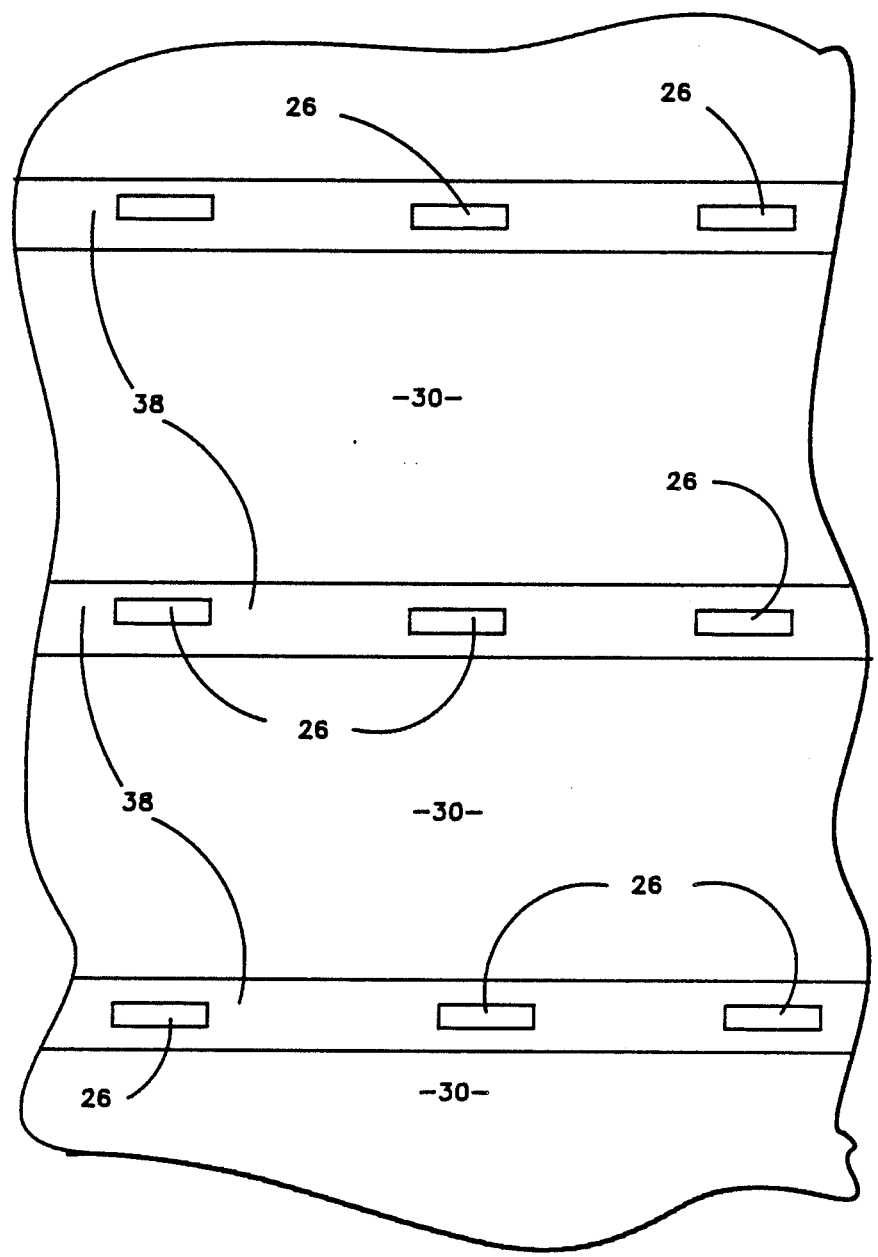
FIG. 4 is an elevational view of the top of the stack of die after lapping and polishing, prior to application of the connection pads.
Figure 5:
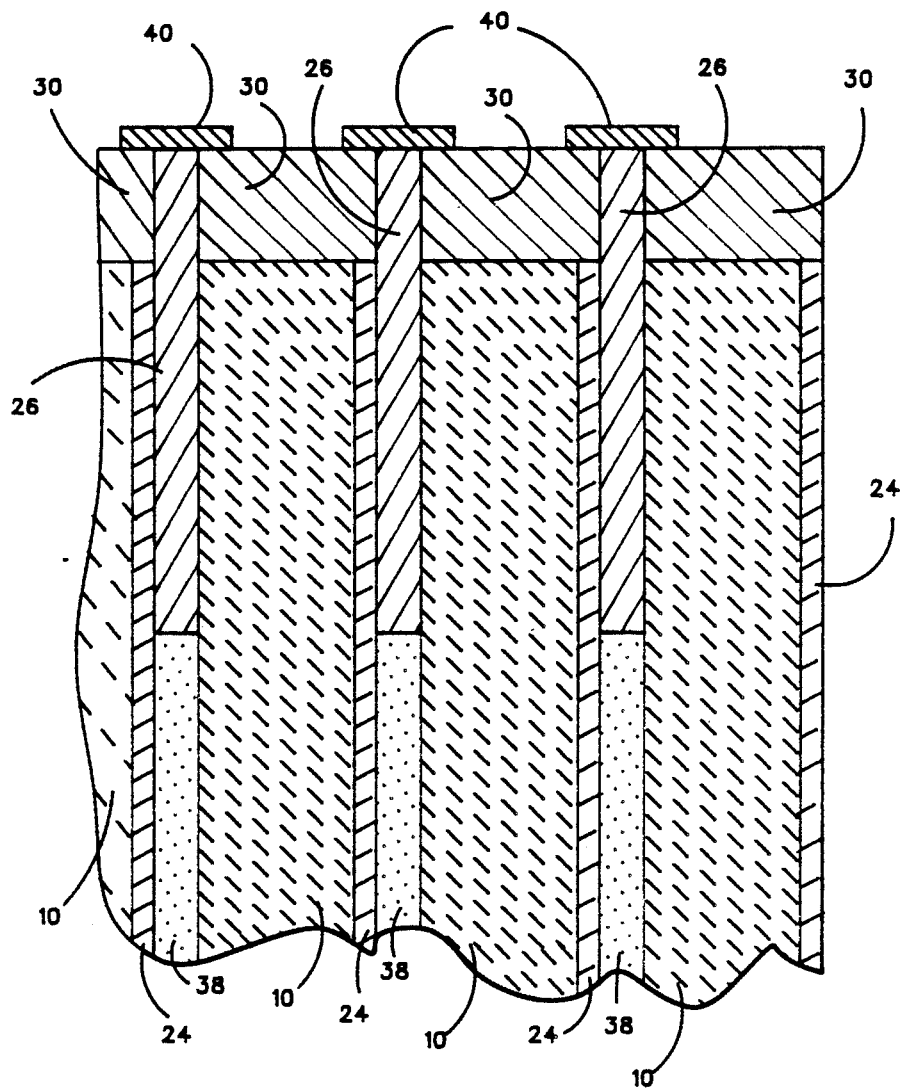
FIG. 5 is a cross sectional view of the stack of die assemblies after application of the detector connection pads.

The surface of the resulting module block comprising the second surfaces 34 of the ceramic spacers is then lapped and polished to expose the gold ribbon leads 26 and provide a very fine, flat bonding surface. The surface may be ground with conventional grinding techniques using a 3-micron grit diamond. The spacers, which may have an initial width of 0.030 inches, may be ground to a width of approximately 0.010–0.015 inches. The polishing removes enough of the spacers so that the ends of the gold ribbon leads are exposed at the edge of the spacer. Referring to FIG. 3, the spacers may be ground to the line 37. FIG. 4 is an elevational view of the polished surface, showing the exposed ends of the gold leads 26, the ceramic spacers 30, and the epoxy fill 38 between the spacers. FIG. 5 is a cross sectional view of the module after surface polishing.

After grinding the ceramic spacers, the flat planar surface for bonding to the detector arrays is hard for withstanding the pressures inherent in the bonding process. Additionally, the very hard ceramic spacers hold the gold ribbon leads in place very accurately during assembly of the module stack. In many circumstances this is an important improvement over the use of epoxy to fill the spaces between the conductors. Epoxy is a softer material that may tend to deform, thus interfering with the accurate X, Y, and Z placement of the connector ends for later mating with the connector pads for the detector array. Furthermore, the ceramic can be reworked if a sufficiently planar surface is not obtained after the first polishing.

Connection pads 40 are attached to the bonding surface at each of the exposed ends of the gold ribbon leads 26 (FIG. 5). The connection pads 40 may be deposited using conventional techniques. Pads having relatively large center spacing (such as 9 mil) may be deposited using a shadow mask or using photolithographic techniques such as etching or resist lift-off. For closer spacing of the pads (such as 5 mil), photolithographic techniques may be used.

Figure 6:
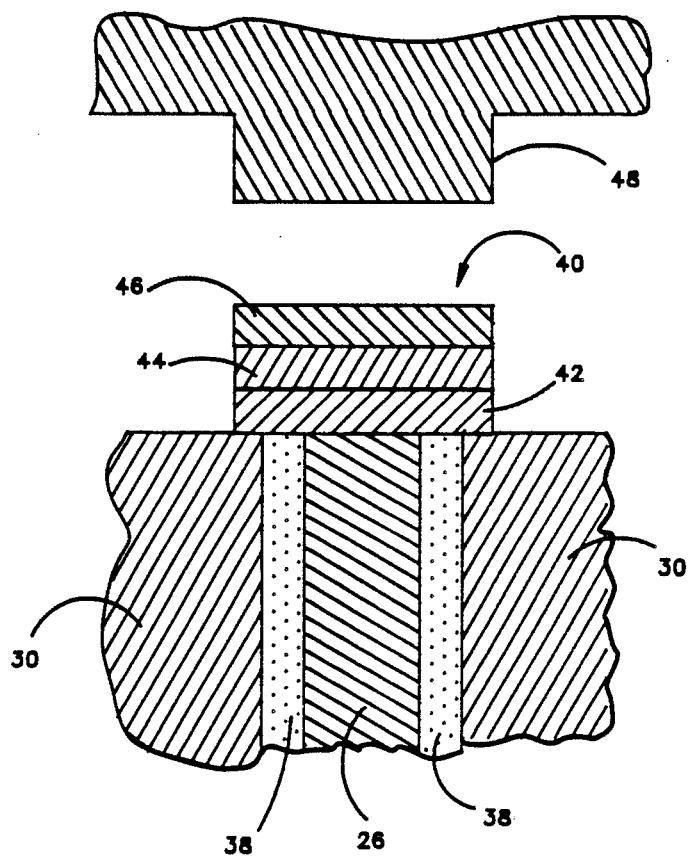
FIG. 6 is a cross sectional view of a connector pad and an associated column of a detector array.

The pads 40 may include three layers of metal, as shown in FIG. 6 and is known in the art. The bottom layer 42 may be formed of titanium for adhesion to the gold ribbon 26 and to the spacer 30. Chrome or tungsten may also be used. The middle layer 44 may be formed of nickel, to create a barrier between the top and bottom layers. The top layer 46 may be formed of indium for bonding to the indium bumps or columns on the back side of the detector array. The pad may be formed to a height of approximately one-half mil.

A laser beam may be reflected from the lapped and polished ceramic surface to determine the exact surface plane, for exact planarity of the surface and the detector array to ensure maximum connection between the detector array and the bonding pads 40. As the exposed epoxy 38 in the spaces between the ceramic spacers is a small fraction of the total bonding surface, the epoxy (which does not reflect the laser light) does not interfere with the identifying of the plane of the bonding surface. As the connector pads 40 are small relative to the overall bonding surface, and the indium is nonreflective, the connector pads do not interfere with the identification of the plane.

A detector array may be attached to the connection pads 40. The detector array has on its back side an indium bump or column 48 for each detector. Each bump 48 is mated to a corresponding connector pad 40.

During handling of the detector array and the electronics module, the indium on the surface of the pad 40 and the column 48 tends to oxidize a little. To effectively cold weld the two together, pressure is applied to displace the thin layers of oxidation and make contact between layers of clean indium metal.

Between two and four grams of force per bump/connector pad pair is required. For pads that are spaced approximately 0.005 inches apart, the pressure required is approximately 2,500 to 3,000 pounds per square inch. The height of the bumps and the pads may as a result be reduced by about half, to 0.00025 inches ($\frac{1}{4}$ mil), or about 6–7 microns.

The resulting structure has a substantially uniform expansion and contraction characteristics. Consequently, as the detector array and electronics are cycled to the cryogenic temperatures at which they typically operate, they are not prone to thermally induced stress, minimizing structural failures.

Although particular embodiments and particular materials have been described herein, certain variations will be apparent to those skilled in the art. The scope of the invention is defined in the following claims.

We claim:

1. A three-dimensional focal plane assembly comprising a plurality of die assemblies stacked adjacent one another, wherein each die assembly comprises:
    a silicon electronic die incorporating electronic circuitry and having first and second faces separated by a first thickness, and a third face between said first and second faces across said first thickness;
    a dielectric layer having first and second dielectric faces, wherein said first dielectric face is bonded to said second face of said die, said dielectric layer having a second thickness between its first and second faces and having a third dielectric face, between said first and second dielectric faces across said second thickness, wherein said third dielectric face and said third die face are substantially coplanar;
    a ceramic spacer having first and second surfaces, and having a third thickness between said first and second surfaces substantially the same as said first and second thickness together, said spacer additionally having a third spacer surface, between said first and second spacer surfaces, wherein said third spacer surface abuts said third die surface and said third dielectric surface so that said first die face and said first spacer surface are substantially coplanar and said second dielectric face and said second spacer surface are substantially coplanar; and
    a gold ribbon lead bonded to said first face of said silicon die and to said first surface of said ceramic spacer.

2. The three-dimensional focal plane assembly of claim 1, wherein each of said ceramic spacers is formed of an electrically nonconductive material having a thermal expansion properties similar to those of silicon.

3. The three-dimensional focal plane assembly of claim 2, wherein each of said ceramic spacers is formed of aluminum oxide.

4. The three-dimensional focal plane assembly of claim 2, wherein each of said ceramic spacers is formed of berillium oxide.

5. The three-dimensional focal plane assembly of claim 2, wherein each of said ceramic spacers is formed of aluminum nitride.

6. The three-dimensional focal plane assembly of claim 1, wherein each die assembly additionally comprises a plurality of gold ribbon leads, each bonded to said first face of said silicon electronic die and to said first surface of said corresponding ceramic spacer.

7. The three-dimensional focal plane assembly of claim 6, wherein each silicon electronic die has a plurality of bond pads, and each ceramic spacer is metallized with a plurality of bonding areas corresponding to said bond pads, and each of said gold ribbon leads connects a bond pad on said silicon die and a bonding area of said ceramic spacer.

8. The three-dimensional focal plane assembly of claim 7, additionally comprising epoxy backfill between the dielectric face of a die and the silicon face of an adjacent die.

9. A three-dimensional focal plane assembly comprising:
    a plurality of die assemblies, each comprising:
        a silicon electronic die having first and second substantially parallel die surfaces separated by a first thickness, having a third surface across said first thickness, having formed thereon electronic circuitry, and having on said first die surface a plurality of bonding pads;
        a dielectric layer having first and second dielectric layer surfaces separated by a second thickness and having its first surface bonded to said second die surface;
        a ceramic spacer formed of an electrically nonconductive material having a low coefficient of thermal expansion similar to that of silicon, wherein said ceramic spacer has first and second spacer surfaces separated by a spacer thickness substantially the same as said first and second thicknesses together, and said first ceramic spacer surface is metallized with a plurality of bonding areas corresponding to said silicon die bonding pads, said ceramic spacer additionally having a third spacer surface across said spacer thickness, and a fourth spacer surface across said spacer thickness, opposite said third spacer surface, wherein said third spacer surface abuts said third die surface; and a plurality of gold ribbon leads, each bonded to one of said bonding pads on said silicon die and to the corresponding bonding area of said ceramic spacer, wherein the ends of said leads coincide with said fourth spacer surface of said ceramic spacer; and epoxy bonding material between said second dielectric surface of said dielectric layer of one of said die assemblies and said first die surface of said silicon die of an adjacent die assembly;

wherein said die assemblies are stacked adjacent one another so that said fourth spacer surfaces of said spacers are aligned with one another forming a planar surface.

10. The three-dimensional focal plane assembly of claim 9, wherein said ceramic spacers are formed of aluminum oxide.

11. The three-dimensional focal plane assembly of claim 10, wherein said dielectric is formed of silicon nitride.

12. The three-dimensional focal plane assembly of claim 1, wherein said second face of said dielectric layer of a first die assembly is bonded to said first face of said electronic die of an adjacent die assembly.

13. A three-dimensional assembly of a plurality of separate electronic integrated circuit chips for attachment to a focal plane array, comprising:

a plurality of electronic integrated circuit chips, each having a front face, a back face substantially parallel to said front face, a chip thickness between said front face and said back face, and a first edge face between said front face and said back face, said chip containing electronic circuitry and a plurality of bonding pads on said front face;

a plurality of dielectric layers, each having a first face, a second face substantially parallel to said first face, a dielectric thickness between said first and second faces, and a first edge face between said first and second dielectric faces, wherein said first face of each dielectric layer is bonded to the back face of a corresponding chip so that said first edge face of said dielectric coincides with said first edge face of said chip;

a plurality of ceramic spacers, each having a first surface, a second surface substantially parallel to said first surface, a thickness between said first and second surfaces substantially equal to said chip thickness and said dielectric thickness together, each of said ceramic spacers additionally having third and fourth surfaces substantially perpendicular to said first and second surface, wherein said third surface of each spacer abuts said first edge faces of a corresponding chip and dielectric pair;

a plurality of conductors, each connected to one of said chip bonding pads and extending across said first surface of the corresponding spacer and having an end coinciding with said fourth surface of said spacer;

wherein said chip and dielectric pairs are stacked so that said chips and dielectric layers alternate and said fourth surfaces of said ceramic spacers are aligned to form a planar surface, and so that the ends of said conductors connected to one of said chips is at least approximately 0.005 inches from the ends of said conductors connected to an adjacent chip, said assembly further comprising:

a plurality of connection pads on said planar surface, wherein each of said connection pads is connected to the end of a corresponding one of said conductors.

14. The three-dimensional focal plane assembly of claim 1, wherein:

said third die face of each of said silicon electronic die is substantially perpendicular to said first and second die faces;

said third dielectric face of each of said dielectric layers is substantially perpendicular to said first and second dielectric faces; and said third spacer surface of each of said spacers is substantially perpendicular to said first and second spacer surfaces.

* * * * *